(12) United States Patent
Ruff et al.

(10) Patent No.: US 6,699,747 B2
(45) Date of Patent: Mar. 2, 2004

(54) METHOD FOR INCREASING THE CAPACITANCE IN A STORAGE TRENCH

(75) Inventors: Alexander Ruff, Dresden (DE); Wilhelm Kegel, Langenbrück (DE); Wolfram Karcher, Weissig (DE); Martin Schrems, Langenbrück (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/298,394

(22) Filed: Nov. 18, 2002

(65) Prior Publication Data

US 2003/0073283 A1 Apr. 17, 2003

Related U.S. Application Data

(63) Continuation of application No. 09/796,213, filed on Feb. 28, 2001, now abandoned.

(30) Foreign Application Priority Data

Feb. 29, 2000 (DE) .......................................... 100 10 821

(51) Int. Cl.⁷ .......................................... H01L 21/8242
(52) U.S. Cl. ...................... 438/240; 438/246; 438/387; 438/389; 438/244
(58) Field of Search ................................. 438/240, 244, 438/246, 387, 389, 239–256, FOR 220

(56) References Cited

U.S. PATENT DOCUMENTS

| 4,432,035 | A | * | 2/1984 | Hsieh et al. ............... 361/322 |
| 4,453,199 | A | * | 6/1984 | Ritchie et al. ............. 361/306.1 |
| 4,557,036 | A | * | 12/1985 | Kyuragi et al. |
| 4,918,502 | A | | 4/1990 | Kaga et al. |
| 5,195,018 | A | | 3/1993 | Kwon et al. |
| 5,276,343 | A | | 1/1994 | Kumagai et al. |
| 5,428,236 | A | | 6/1995 | Uchida |
| 5,444,006 | A | | 8/1995 | Han et al. |
| 5,471,418 | A | | 11/1995 | Tanigawa |
| 5,508,545 | A | * | 4/1996 | Uchiyama |
| 5,576,223 | A | * | 11/1996 | Zeininger et al. |
| 5,876,788 | A | | 3/1999 | Bronner et al. |
| 5,936,831 | A | | 8/1999 | Kola et al. |
| 6,020,609 | A | | 2/2000 | Wu |
| 6,054,358 | A | * | 4/2000 | Okamoto |
| 6,153,491 | A | | 11/2000 | Kotecki et al. |
| 6,157,055 | A | | 12/2000 | Yamaguchi et al. |
| 6,177,699 | B1 | | 1/2001 | Perng et al. |
| 6,191,443 | B1 | | 2/2001 | Al-Shaaref et al. |
| 6,203,613 | B1 | | 3/2001 | Gates et al. |
| 6,261,895 | B1 | | 7/2001 | Adkisson et al. |
| 6,323,078 | B1 | | 11/2001 | Bhowmik et al. |
| 6,373,087 | B1 | | 4/2002 | Harris et al. |
| 6,503,819 | B2 | * | 1/2003 | Tanabe et al. |
| 2002/0119622 | A1 | * | 8/2002 | Steigerwald et al. |

FOREIGN PATENT DOCUMENTS

| DE | 42 21 959 A1 | 1/1993 |
| DE | 43 37 889 A1 | 5/1994 |

OTHER PUBLICATIONS

L. Manchanda et al.: "Yttrium Oxide/Silicon Dioxide: A New Dielectric Structure for VLSI/ULSI Circuits", *IEEE Electron Device Letters*, vol. 9, Apr. 1988, No. 4, pp. 180–182.

* cited by examiner

*Primary Examiner*—George Fourson
*Assistant Examiner*—Joannie Adelle Garcia
(74) *Attorney, Agent, or Firm*—Laurence A. Greenberg; Werner H. Stemer; Ralph E. Locher

(57) ABSTRACT

In a method for forming a trench capacitor a first layer of silicon oxide is deposited in a storage trench and a layer of silicon is deposited over the first layer by a chemical vapor deposition process. A layer of an oxidizable metal is deposited over the layer of silicon. The layer of silicon and the layer of the oxidizable metal are subsequently oxidized to form a layer of silicon oxide and metal oxide.

14 Claims, 4 Drawing Sheets

METHOD FOR INCREASING THE CAPACITANCE IN A STORAGE TRENCH

CROSS-REFERENCE TO RELATED APPLICATION

This application is a continuation of U.S. application Ser. No. 09/796,213, filed Feb. 28, 2001, now abandoned.

BACKGROUND OF THE INVENTION

FIELD OF THE INVENTION

The invention relates to a method for increasing a capacitance in a storage trench and to a trench capacitor having an increased capacitance.

The invention can be used in memory circuits, such as, for example, dynamic random access memories (DRAM) and other semiconductor circuits.

In trench DRAM modules, a storage of charge is based in a capacitor as a storage element, which is formed in a pot-shaped manner. This entails not only a reduction of the cell area but also, at the same time, a reduction of the probability of alpha particles striking the cell. Such a pot-shaped capacitor is formed in a trench and is also referred to as a trench capacitor. The store of the trench cell has a trench that must keep a specific quantity of charge stored for a specific period of time.

In order to maintain and increase international competitiveness, it is necessary to continually reduce the costs that have to be expended to realize a specific electronic function, in order to increase productivity. The guarantee for increasing productivity in recent years has been and still is CMOS technology or DRAM technology. Trench DRAM technology owes its outstanding position principally to the small space requirement of the trench capacitors themselves and also to the possibility of disposing the trench capacitors in an integrated circuit with an extremely high packing density.

The continually progressing miniaturization of the structures is accompanied by a decrease in the diameter of the trench and hence its surface area, with the result that less charge can be stored in the case of conventional technology.

The prior art disclosed in U.S. Pat. No. 5,876,788 teaches a method for fabricating a dielectric for the DRAM cells. In this case, $Si_3N_4$ is used, on account of its relatively high dielectric constant, as a dielectric for increasing the storage capacitance. The use of this dielectric causes a number of problems principally in the case of decreasing lateral dimensions. In order to avoid the loss of charge associated with a decreasing diameter in DRAM cells, it has been proposed to etch the trench more deeply or to reduce the thickness of the silicon nitride layer. However, etching a deeper trench would disadvantageously increase the process time and the costs for fabrication. Reducing the layer thickness of the silicon nitride film can bring about an increase in the loss due to the tunnel effect.

SUMMARY OF THE INVENTION

It is accordingly an object of the invention to provide a method for increasing the capacitance in a storage trench and a trench capacitor having an increased capacitance which overcome the above-mentioned disadvantages of the prior art devices and methods of this general type, in which, despite an increased packing density, sufficient charge can be stored so that the functionality of a memory cell continues to be ensured.

With the foregoing and other objects in view there is provided, in accordance with the invention, a method for increasing a capacitance in a storage trench. The method includes the steps of depositing a layer of silicon oxide in the storage trench; depositing a layer of silicon over the layer of silicon oxide by a deposition method suitable for sufficient coverage of walls of the storage trench; depositing a layer having an oxidizable metal over the layer of silicon; and oxidizing the layer of silicon and the layer having the oxidizable metal to form a layer having a metal oxide and an silicon oxide.

In the method for increasing the capacitance in the storage trench, the first layer of silicon oxide is deposited in the storage trench. The layer of silicon is deposited over the first layer of silicon oxide by a deposition method which yields a sufficient coverage of the side walls of the storage trench. The layer having an oxidizable metal is deposited over the layer of silicon. The layer of silicon and the layer of oxidizable metal are oxidized to form a layer having metal oxide and silicon oxide.

In the trench capacitor having the increased capacitance, the inner wall of the storage trench is covered with the first layer of silicon oxide. The first layer of silicon oxide is covered with the layer having a metal oxide. The layer having the metal oxide is covered with a second layer of silicon oxide. The remainder of the storage trench is filled with silicon.

Chemical vapor deposition or atomic layer deposition may advantageously be used as the deposition method.

In the method according to the invention, it is advantageous if the second layer of silicon oxide is deposited over the layer having metal oxide and silicon oxide.

It is also advantageous if the layer of oxidizable metal has Ti, TIN, W, WN, Ta, TaN, WSi, TiSi or TaSi.

The oxidation is advantageously carried out in an oxygen-containing atmosphere. This achieves intensified oxidation of the respective metal.

Furthermore, it is advantageous to fill the storage trench with silicon.

For the method according to the invention, it is advantageous if the storage trench has a width of less than 140 nm.

In the method according to the invention, it is particularly preferred if the first layer of silicon oxide has a thickness of approximately 0.3 nm.

In the method according to the invention, it is likewise particularly preferred if the second layer of silicon oxide has a thickness of approximately 0.3 nm.

Furthermore, it is preferred if the first and the second layer of silicon oxide are deposited by a chemical vapor deposition process.

In the method according to the invention, it is particularly preferred if the layer of silicon has a thickness of approximately 0.5 nm.

In the method according to the invention, it is particularly preferred if the silicon used is particularly suitable for coverage of the side wall.

It is advantageous for the method according to the invention that the layer of oxidizable metal has a thickness of approximately 10 nm.

Furthermore, it is advantageous for the method according to the invention if the layer having the oxidizable metal is deposited by a chemical vapor deposition process.

With the foregoing and other objects in view there is further provided, in accordance with the invention, a trench capacitor having an increased capacitance. The trench capacitor contains a substrate having a storage trench formed therein and the storage trench is defined by side walls and a bottom. A first layer of silicon oxide covers the side walls and the bottom of the storage trench. A layer having a metal oxide covers the first layer of silicon oxide. A second layer of silicon oxide covers the layer having the metal oxide and silicon fills in a remainder of the storage trench.

Other features which are considered as characteristic for the invention are set forth in the appended claims.

Although the invention is illustrated and described herein as embodied in a method for increasing the capacitance in a storage trench and a trench capacitor having an increased capacitance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
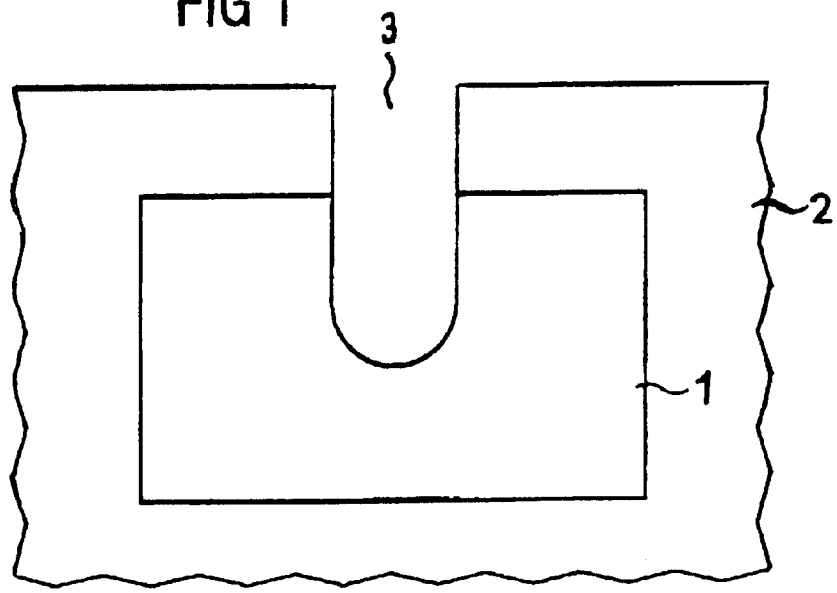
FIG. 1 is a diagrammatic, cross-sectional view of a trench capacitor prior to being coated according to the invention.

In all the figures of the drawing, sub-features and integral parts that correspond to one another bear the same reference symbol in each case. Referring now to the figures of the drawing in detail and first, particularly, to FIG. 1 thereof, there is shown in cross section a buried n-type zone 1 (buried n-type plate) surrounded by a substrate 2. A storage trench 3 is situated in the substrate 2 and the buried n-type zone 1.

Figure 2:
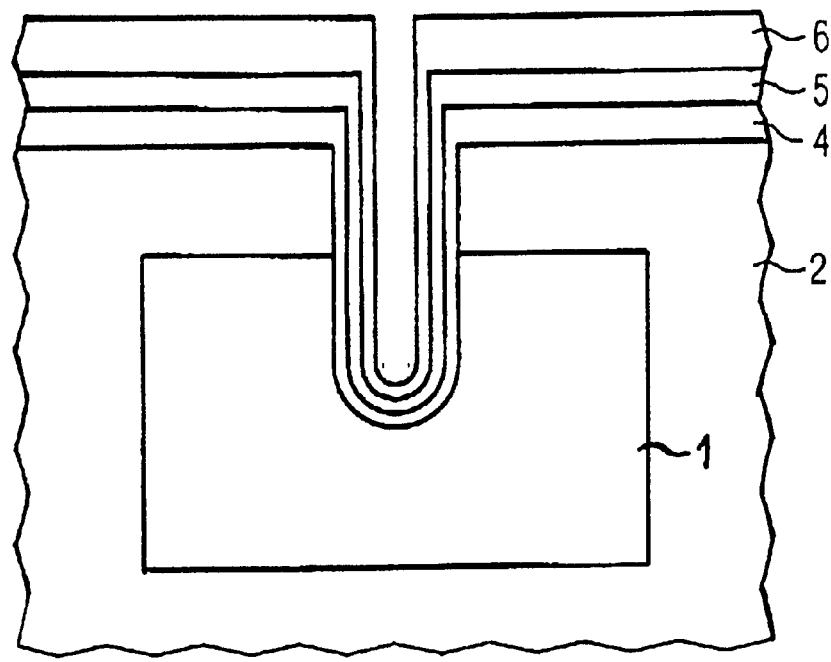
FIG. 2 is a cross-sectional view of the trench capacitor after being coating with a silicon oxide layer, a silicon layer and a metal layer.

FIG. 2 shows the storage trench 3 in cross section. A surface of the substrate 2 and also an inner wall of the storage trench 3 are coated with a first layer of silicon oxide 4.

The silicon oxide 4 has a smaller layer thickness on the wall of the trench 3 than on a top side of the substrate 2. The ratio of the layer thickness on the top side of the substrate 2 to the side walls of the trench 3 may be 2:1. The silicon oxide deposition on the top side of the substrate 2 is approximately 0.3 nm. The silicon oxide 4 is advantageously deposited in a furnace in which the prepared trench store is situated.

The first layer of silicon oxide 4 is covered with a layer of silicon 5 in a further process step. In the case of the layer of silicon 5, too, the layer thickness is larger in the horizontal region than in the vertical region. The silicon layer 5 can best be achieved in a furnace at 550 degrees Celsius by a low pressure chemical vapor deposition (LPCVD) process.

For depositing the layer of silicon 5, a so-called atomic layer deposition (ALD) method can also be used instead of the CVD method. This involves a deposition method for fabricating an extremely thin silicon layer, preferably having a thickness of just a few atomic layers. In the ALD method, unlike in the CVD method, use is made essentially of the chemical affinity of the surface for the individual molecules or radicals. These are added from a vapor phase to a surface to be coated, until all free valences are saturated. As a result, the deposition is self-limiting and closed.

A layer 6 having an oxidizable metal is deposited above the layer of silicon 5. The metal of the layer 6 may optionally have Ti, TiN, W, WN, Ta, TaN, Wsi, TiSi or TaSi. The layer 6 covers the silicon layer 5 both in the horizontal region and in the vertical region. In this case, too, the layer thickness of the metal layer 6 is greater in the horizontal region than in the vertical region. In the horizontal region, the layer thickness of the metal layer 6 is approximately 10 nm. The layer 6 having the metal is advantageously deposited by a chemical vapor deposition (CVD) process.

The layer of silicon 5 serves as a wetting layer for the metal layer 6. This enables or supports the subsequent deposition of the metal and ensures sufficient adhesion of the metal on the side walls. The silicon layer 5 additionally increases the capacitance of the dielectric layer through oxidation of the metal layer 6 in the trench capacitor.

In the text below, titanium and tungsten are used by way of example for the oxidizable metal layer 6.

Figure 3:
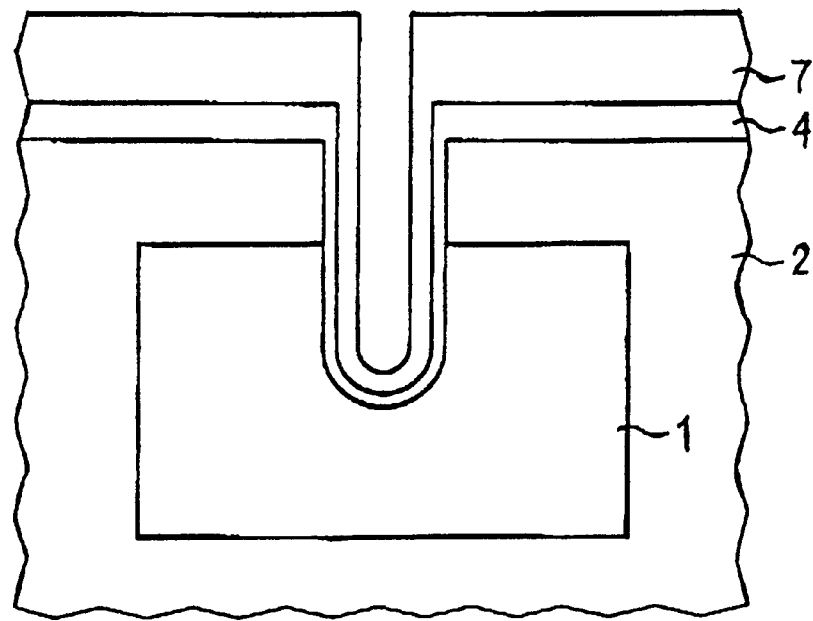
FIG. 3 is a cross-sectional view of the trench capacitor after oxidation of the silicon layer and of the metal layer.

After oxidation of the silicon layer 5 and of the titanium or tungsten layer 6, the trench capacitor has a layer structure as shown in FIG. 3. The titanium oxide/titanium silicon oxide layer or tungsten oxide/tungsten silicon oxide layer 7 is produced from the two layers of silicon 5 and titanium or tungsten 6, respectively. Whether titanium oxide or titanium silicon oxide or both are produced in the layer 7 depends on the process control. However, a process control in which titanium oxide is produced is preferred, since the latter has a higher dielectric constant than titanium silicon oxide. The production of silicon oxide should be avoided by a suitable process control.

The same applies to the production of tungsten oxide or tungsten silicon oxide. In this case, too, tungsten oxide is preferred since tungsten oxide has a higher dielectric constant than tungsten silicon oxide. This makes it possible to increase the storage capacitance of the trench capacitor. During the oxidation of the silicon layer 5 and of the titanium or tungsten layer 6, the resulting layer 7 grows, as a result of the additionally incorporated oxygen, to a layer thickness of approximately 15 nm in the horizontal region. A layer thickness of the layer 7 of approximately 10 to 20 nm can be assumed in the vertical region. In this case, the aim is to allow the layer 7 to become as thick as possible in the vertical region of the trench 3.

Figure 4:
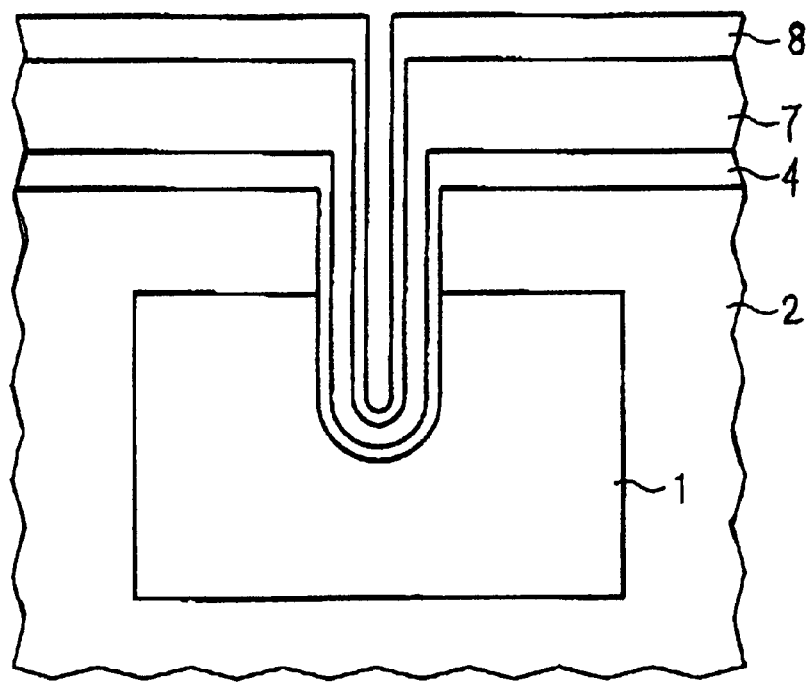
FIG. 4 is a cross-sectional view of the trench capacitor with an additional silicon oxide layer.

As shown in FIG. 4, a surface of the titanium oxide/titanium silicon oxide layer or tungsten oxide/tungsten silicon oxide layer 7 is covered by a second layer of silicon oxide or silicon nitride 8. The second layer of silicon oxide or silicon nitride 8 is thinner in the vertical region than in the horizontal region. The horizontal layer thickness of the second silicon oxide layer 8 is approximately 0.3 nm.

Figure 5:
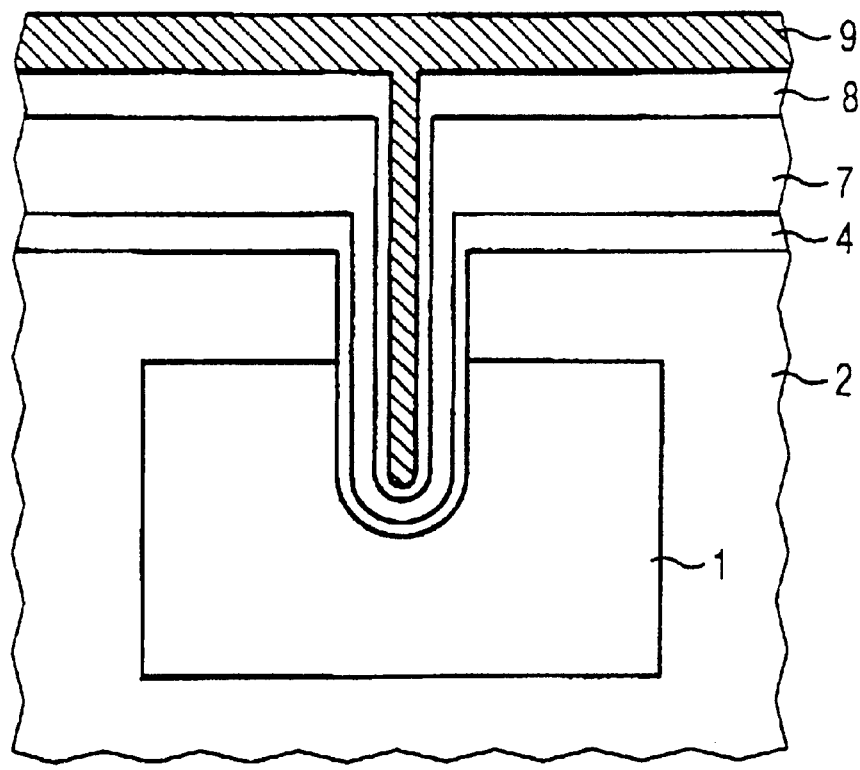
FIG. 5 is a cross-sectional view of the trench capacitor with a silicon filling.

As shown in FIG. 5, the storage trench 3 is subsequently filled with silicon 9 in a further process step.

Figure 6:
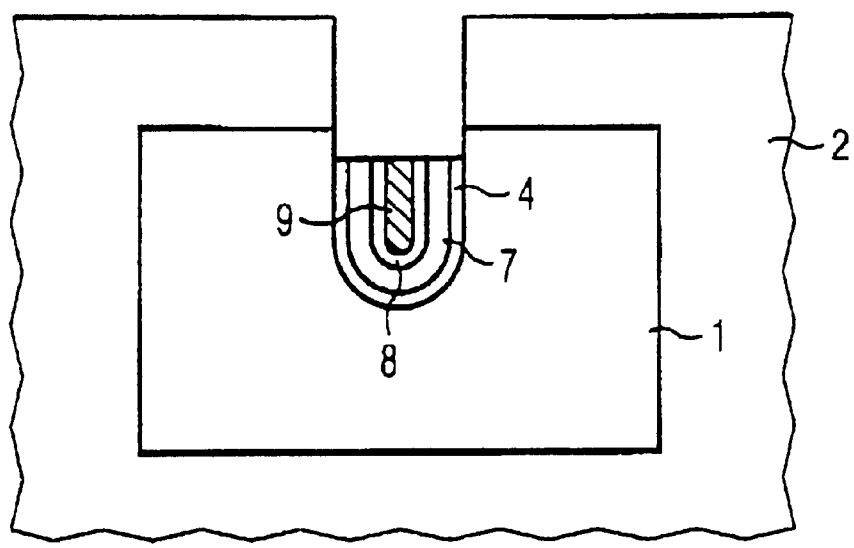
FIG. 6 is a cross-sectional view of the trench capacitor after an etching-away process.

Finally, in further process steps, the entire layer structure is removed again until a structure as shown in FIG. 6 is produced. This can be effected by dry chemical etching and subsequent wet cleaning. The material removal process is stopped below the upper edge of the buried plate region.

Figure 7:
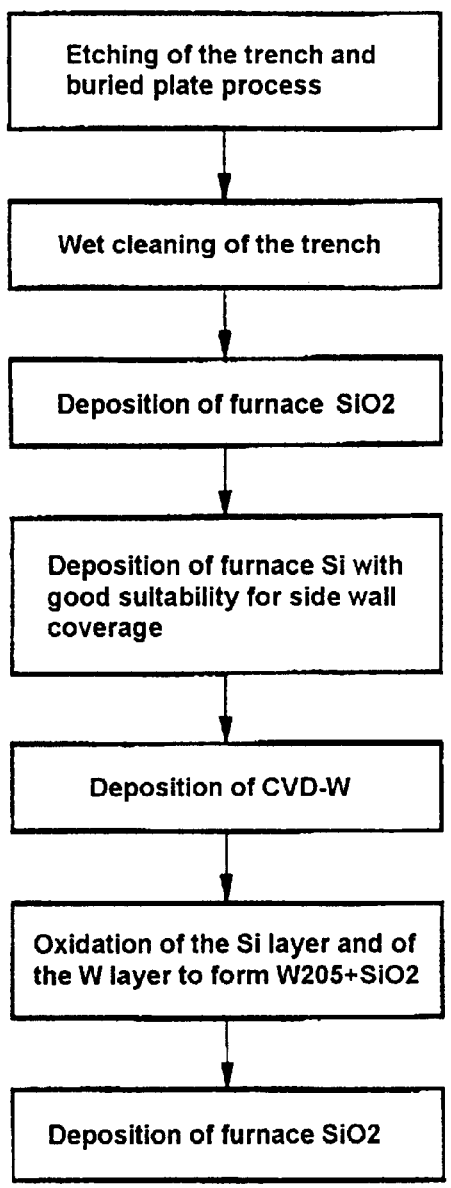
FIG. 7 is a flow chart showing individual process steps of the method according to the invention in a case where tungsten is used.

FIG. 7 illustrates the fabrication method in the form of a structogram. After the etching of the trench 3 and the buried plate process, step 100, wet cleaning of the trench 3 is carried out, step 110. Afterward, silicon oxide 4 is deposited with a layer thickness of approximately 0.3 nm (as shown in FIG. 2). The silicon oxide 4 used is also referred to as a furnace silicon oxide, step 120. In a further process step 130, a furnace silicon 5 is deposited, which has the property of covering the side walls of the trench 3 well. Afterward, tungsten 6 (layer thickness 10 nm) is deposited by a chemical vapor deposition process, step 140. In the next process step 150, the silicon layer 5 and the tungsten layer 6 are oxidized to produce tungsten oxide 7. Finally, the second silicon oxide layer or silicon nitride 8 is deposited in a furnace, step 160.

Figure 8:
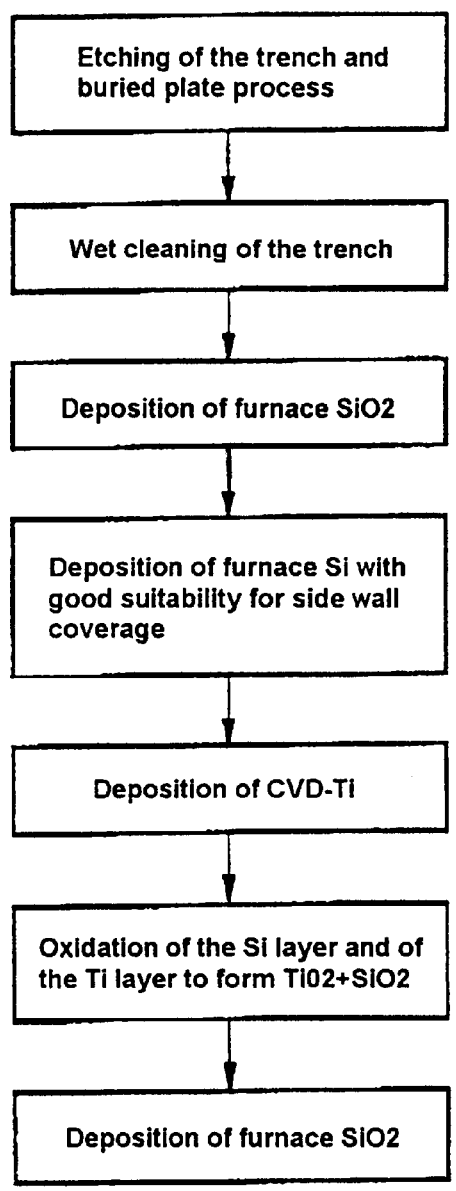
FIG. 8 is a flow chart showing the individual process steps of the method according to the invention in the case where titanium is used.

FIG. 8 shows a structogram to specify the method for increasing the capacitance in the storage trench using titanium. As described above, first the etching of the trench 3 and the buried plate process are carried out, step 200.

Afterward, the wet cleaning of the trench is carried out in step 210 and, in a further step 220, the deposition of furnace silicon oxide is carried out. In a further process step 230, furnace silicon is deposited in a furnace at 550 degrees Celsius by a low pressure chemical vapor deposition process. Afterward, titanium 6 (layer thickness 10 nm) is deposited by a chemical vapor deposition process, step 240. In the next process step 250, the silicon layer 5 and the titanium layer 6 are oxidized to form the titanium oxide layer 7. Finally, the second furnace silicon oxide layer or silicon nitride 8 is deposited above that, step 260.

The buried plate process serves for insulating the trench capacitor from a transistor that is necessary for the DRAM memory module.

The silicon layer 5 supports the nucleation and also the adhesion of the desired metal layer (titanium or tungsten) and can be oxidized in conjunction with the subsequently deposited metal layer 6.

The layer thicknesses specified above merely represent guide values. In the case of further reduction of the trench width, the individual layer thicknesses should be adapted accordingly.

We claim:

1. A method for increasing a capacitance in a storage trench, which comprises the steps of:
    depositing a layer of silicon oxide in the storage trench;
    depositing a layer of silicon over the layer of silicon oxide by a deposition method suitable for sufficient coverage of walls of the storage trench;
    depositing a layer having an oxidizable metal over the layer of silicon; and
    oxidizing the layer of silicon and the layer having the oxidizable metal to form a layer having a metal oxide and a silicon oxide.

2. The method according to claim 1, which comprises using one of a chemical vapor deposition process and an atomic layer deposition process as the deposition method.

3. The method according to claim 2, which comprises depositing a further layer formed of a material selected from the group consisting of silicon oxide and silicon nitride over the layer having the metal oxide and the silicon oxide.

4. The method according to claim 1, which comprises using a metal selected from the group consisting of Ti, TiN, W, WN, Ta, TaN, WSi, TiSi and TaSi as the oxidizable metal of the layer having the oxidizable metal.

5. The method according to claim 1, which comprises carrying out the oxidizing step in an oxygen-containing atmosphere.

6. The method according to claim 1, which comprises filling the storage trench with silicon.

7. The method according to claim 1, which comprises forming the storage trench to have a width of less than 140 nm.

8. The method according to claim 1, which comprises forming the layer of silicon oxide to have a thickness of approximately 0.3 nm.

9. The method according to claim 3, which comprises forming the further layer to have a thickness of approximately 0.3 nm.

10. The method according to claim 3, which comprises depositing the layer of silicon oxide and the further layer by a chemical vapor deposition process.

11. The method according to claim 1, which comprises forming the layer of silicon to have a thickness of approximately 0.5 nm.

12. The method according to claim 1, which comprises using silicon in the layer of silicon which is particularly suitable for covering side walls of the storage trench.

13. The method according to claim 1, which comprises forming the layer having the oxidizable metal to a thickness of approximately 10 nm.

14. The method according to claim 1, which comprises depositing the layer having the oxidizable metal by a chemical vapor deposition process.

* * * * *